United States Patent
Imura

(10) Patent No.: US 10,075,098 B2
(45) Date of Patent: Sep. 11, 2018

(54) POWER CONVERTER

(71) Applicant: DENSO CORPORATION, Kariya, Aichi-pref. (JP)

(72) Inventor: Takashi Imura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/658,851

(22) Filed: Jul. 25, 2017

(65) Prior Publication Data

US 2018/0034384 A1    Feb. 1, 2018

(30) Foreign Application Priority Data

Jul. 28, 2016    (JP) ................... 2016-148504

(51) Int. Cl.
| | |
|---|---|
| *H02M 7/539* | (2006.01) |
| *H02M 7/5395* | (2006.01) |
| *H02M 1/08* | (2006.01) |
| *H02P 27/08* | (2006.01) |

(52) U.S. Cl.
CPC ........... *H02M 7/5395* (2013.01); *H02M 1/08* (2013.01); *H02P 27/08* (2013.01)

(58) Field of Classification Search
CPC ........ H02M 7/5395; H02M 1/08; H02P 27/08
See application file for complete search history.

(56) References Cited

U.S. PATENT DOCUMENTS

| | | | | |
|---|---|---|---|---|
| 2004/0085052 | A1* | 5/2004 | Itabashi ................. | H02M 1/36 323/282 |
| 2007/0164691 | A1* | 7/2007 | MacKay ................. | H02P 6/182 318/1 |
| 2016/0072382 | A1* | 3/2016 | Ranmuthu ............. | H02M 3/07 363/60 |

FOREIGN PATENT DOCUMENTS

| | | |
|---|---|---|
| JP | 2008-029085 A | 2/2008 |
| JP | 2014-011841 A | 1/2014 |

\* cited by examiner

*Primary Examiner* — Jue Zhang
(74) *Attorney, Agent, or Firm* — Posz Law Group, PLC

(57) ABSTRACT

An inverter main circuit using high-side MOSFETS converts a power source voltage of a battery to an alternating current, and supplies the alternating current to a three-phase motor. A control circuit drives, via a high-side drive circuit and a low-side drive circuit, the MOSFETS. A charge pump circuit boosts the power source voltage to a charge pump voltage. A bootstrap circuit outputs a bootstrap voltage that is boosted by diodes and capacitors, which is then passed to a clamp circuit for clamping and outputting as a clamp voltage. Based on the supply of the charge pump voltage or the clamp voltage in response to a fluctuation of the power source voltage, a continuous circuit operation is provided while protecting the circuit in operation.

9 Claims, 4 Drawing Sheets

POWER CONVERTER

CROSS REFERENCE TO RELATED APPLICATION

The present application is based on and claims the benefit of priority of Japanese Patent Application No. 2016-148504, filed on Jul. 28, 2016, the disclosure of which is incorporated herein by reference.

TECHNICAL FIELD

The present disclosure generally relates to a power converter, or a converter device for converting electric power.

BACKGROUND INFORMATION

A power converter is conventionally provided with a switching element, which is used for converting a direct current. That is, a power converter may convert a direct current (DC) power source to an alternating current (AC) power source and output a voltage different than the input voltage (i.e. a different electric potential) by turning ON and OFF the switching element with a DC power source when the switching element is in the high side configuration. Such a power converter may use a switching element such as an N-channel type (n-type) Metal Oxide Semiconductor Field Effect Transistor (MOSFET) having a high capacity. In such case, when the MOSFET is driven on the high-side, the source voltage of the MOSFET (i.e. voltage at the MOSFET source) rises to a voltage of a power source after turning ON, with the MOSFET gate requiring a voltage higher than the voltage of the power source for proper operation.

Accordingly, a booster circuit, such as a charge pump circuit or the like, may be used in the above-described circumstance. Further, since the driving capacity provided by the charge pump circuit alone may be insufficient in cases where there is a drop in power source voltage, a bootstrap circuit may be added in some configurations.

However, when used in a vehicle with an in-vehicle battery as the DC power source, a power converter may suffer from fluctuating terminal voltage due to other loads powered by the battery. In cases where a DC source battery rises to excessively high voltage levels, the resulting high voltage in the bootstrap circuit may cause damage or failure to the MOSFET's gate drive circuit.

(Patent document 1) Japanese Patent Laid-Open No. 2014-11841

SUMMARY

It is an object of the present disclosure to provide a power converter with circuit protection to protect against large and excessive fluctuations of the DC power source.

In one aspect of the present disclosure, a power converter includes: a gate-control-type semiconductor element provided on a power supply path from a power source to a load; a high-side drive circuit configured to provide a drive voltage to a gate of the gate-control-type semiconductor element, with the provided drive voltage higher than a power source voltage; a charge pump circuit configured to generate and supply an output voltage to the high-side drive circuit, with the generated output voltage higher than power source voltage; a bootstrap circuit configured to generate an output voltage higher than power source voltage; and a clamp circuit configured to receive the output voltage of the bootstrap circuit, to clamp a higher-than-preset-value voltage to a clamp voltage, and to supply the clamp voltage to the high-side drive circuit.

In the configuration described above, when a voltage spike or surge occurs at the power source voltage, the clamp circuit clamps an excessively high voltage down to a preset voltage even when the bootstrap circuit raises the output voltage to an excessive voltage level. Therefore, the direct application of the high voltage to the high-side drive circuit for driving the gate-control-type semiconductor element by/from the bootstrap circuit is restricted, thereby preventing the failure and/or the damage of the semiconductor element due to the high voltage without having a gate protection circuit.

BRIEF DESCRIPTION OF THE DRAWINGS

Objects, features, and advantages of the present disclosure will become more apparent from the following detailed description made with reference to the accompanying drawings, in which.

DETAILED DESCRIPTION

First Embodiment

Hereafter, the first embodiment of the present disclosure is described with reference to FIGS. 1-3.

Figure 1:
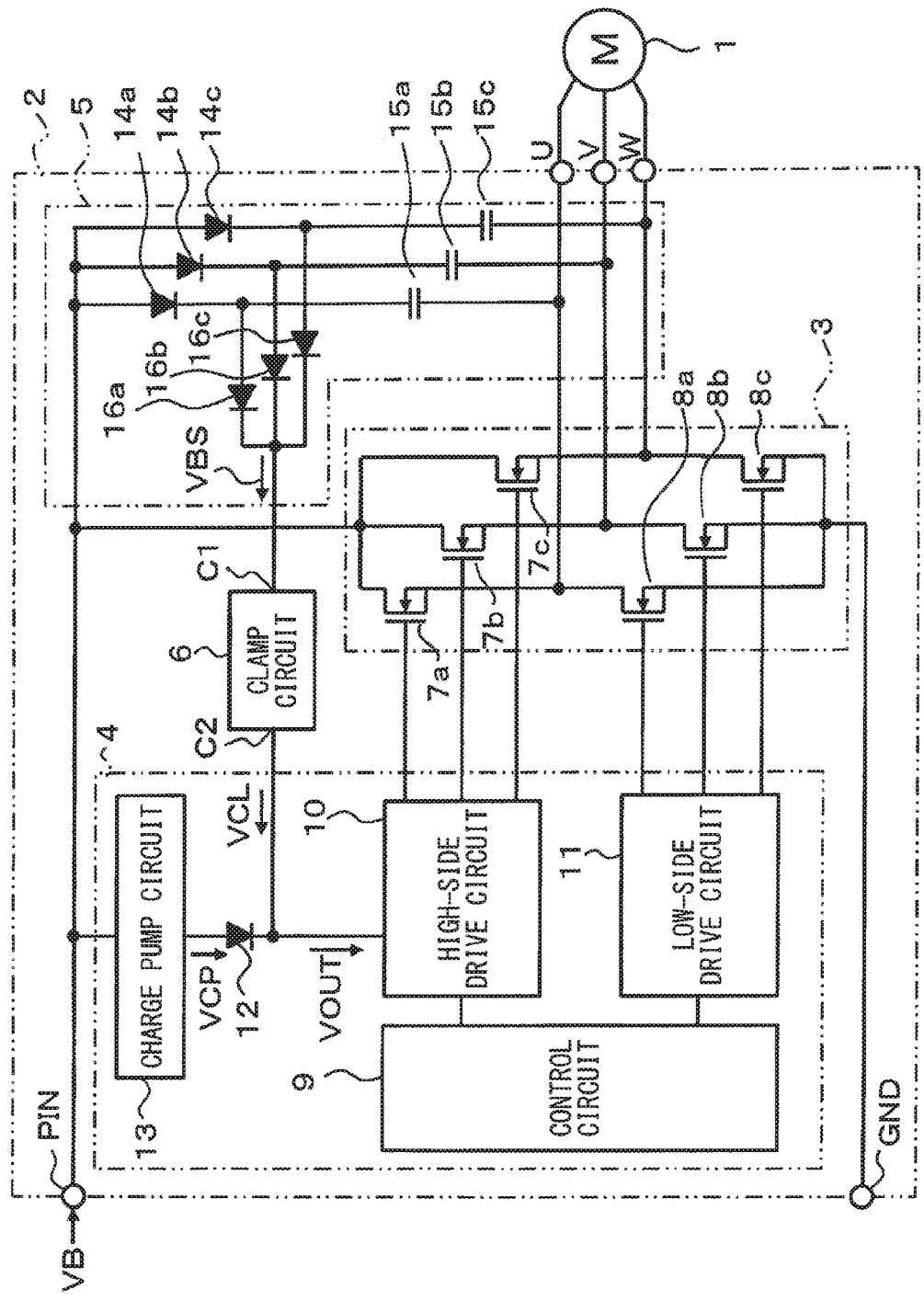
FIG. 1 illustrates a schematic diagram of an inverter device in a first embodiment of the present disclosure.

FIG. 1 shows an inverter device 2, serving as a power converter to convert a power to power an electric load, for example, a three-phase motor 1. The inverter device 2 includes terminals such as a power input terminal PIN and a ground terminal GND, to receive, for example, a DC power source voltage VB from a battery.

Subcomponents of the inverter device 2 may include an inverter main circuit 3, a controller 4, a bootstrap circuit 5, a clamp circuit 6, and the like.

The inverter main circuit 3 is provided as a three-phase bridge connection of six n-type MOSFETS $7a$-$7c$ and $8a$-$8c$, each of which is a gate-controlled type semiconductor device. The MOSFETS $7a$-$7c$ are configured as high-side MOSFETS, and are connected with the MOSFETS $8a$-$8c$ respectively, in series.

The controller 4 may be an integrated circuit (IC) that includes a control circuit 9 of a microcomputer, or like control device. The controller 4 may further include a high-side drive circuit 10, a low-side drive circuit 11, a diode 12, a charge pump circuit 13, and the like. Components may also be combined and packaged as a single IC package. For example, the charge pump circuit 13 and the high-side drive circuit 10 can be packaged as a single IC package.

The control circuit 9 drives the MOSFETS $7a$-$7c$ of the inverter main circuit 3 via the high-side drive circuit 10, and drives the MOSFETS $8a$-$8c$ of the inverter main circuit 3 via the low-side drive circuit 11.

For the high-side drive circuit 10, a high voltage VCP for driving the high-side drive circuit 10 is supplied by the charge pump circuit 13 via the diode 12. A high voltage VCL generated by the bootstrap circuit 5 may also be supplied to the high side drive circuit 10 via the clamp circuit 6.

The controller 4 has a power source circuit (not shown) that generates a preset voltage based on the power source voltage VB input at the power input terminal PIN to power the control circuit 9 and the low-side drive circuit 11.

The control circuit 9 provides a pulse width modulation (PWM) control signal to the inverter main circuit 3 via the high-side drive circuit 10 and the low-side drive circuit 11, and supplies a three-phase AC power output to the three-phase motor 1 from output terminals U, V, and W.

The charge pump circuit 13 provides a voltage boost to the battery voltage supplied at the power input terminal PIN, passes the boosted voltage via the diode 12 in a forward direction, and supplies a preset high voltage to the high-side drive circuit 10.

The bootstrap circuit 5 may include a circuit having three diodes 14a-14c and respective capacitors 15a-15c pairings, with each pair connected in series and arranged between a power source terminal (VB) and one of the output terminals U, V, and W of the three phases.

The terminal voltages of the capacitors 15a-15c are input respectively via diodes 16a-16c to an input terminal C1 of the clamp circuit 6.

In the bootstrap circuit 5, when a potential of one of the output terminals U, V, and W of the three phases drops to the ground potential, the respective capacitor 15a-15c connected to the output terminal U, V, and W is charged by receiving the electric power from the power input terminal PIN via the respective diode 14a-14c. For example, if the output terminal U drops to the ground potential, the capacitor 15a is charged from electric power from the power input terminal PIN via diode 14a.

Further, when the voltage/potential level of the output terminals U, V, and W of the three phases rises to the power source voltage level, the terminal voltage of the respective capacitors 15a-15c is raised and output as a high voltage VBS (i.e., a bootstrap voltage VBS) via a respective diode 16a-16c to the clamp circuit 6. The voltage VBS from the bootstrap circuit 5 is input to the clamp circuit 6 at the input terminal C1.

The clamp circuit 6 outputs the voltage VBS from the bootstrap circuit 5 as is (i.e., without change) until the voltage VBS reaches a preset voltage level. Once the voltage VBS reaches the preset voltage level, the clamp circuit 6 clamps voltage VBS to a clamp voltage VCL, and clamp circuit 6 then outputs clamp voltage VCL. The clamp circuit 6 may be configured as shown in FIG. 2.

Figure 2:
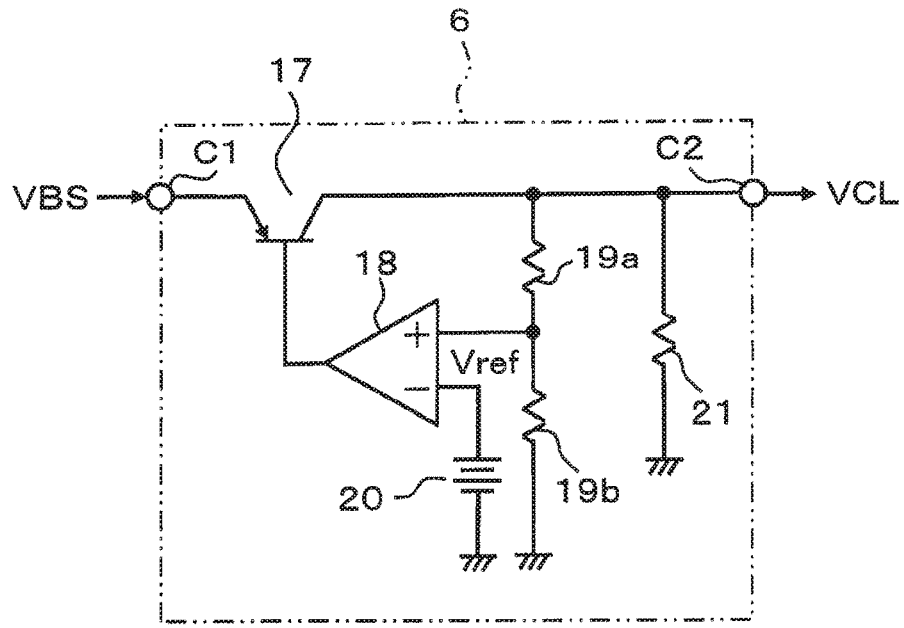
FIG. 2 illustrates a schematic diagram of a clamp circuit in the first embodiment of the present disclosure.

With reference to FIG. 2, the clamp circuit 6 may include a PNP-type bipolar transistor 17. The transistor 17 may be used to produce a constant voltage output by connecting the emitter of transistor 17 to the input terminal C1, connecting the collector of transistor 17 to an output terminal C2 of the clamp circuit 6, and connecting the base of transistor 17 to an output terminal of an operational amplifier (op-amp) 18.

A voltage divider circuit is provided as a series connection of resistors 19a and 19b. The voltage divider circuit is connected between the output terminal C2 and ground, with the output from the voltage divider circuit input to a non-inverted input terminal of op-amp 18. An inverted input terminal of the op-amp 18 receives a reference voltage Vref from a power source 20.

A resistor 21 is connected at a position between the output terminal C2 and ground.

The reference voltage Vref is used to set the clamp voltage VCL in the clamp circuit 6.

As configured, when an input voltage VBS to the input terminal C1 rises, the output voltage VCL at output terminal C2 also rises. However, the terminal voltage of the resistor 19b in the voltage divider circuit also rises at such time, thereby increasing a difference between the terminal voltage of the resistor 19b and the reference voltage Vref.

Thus, the increasing voltage difference between the terminal voltage of the resistor 19b and the reference voltage VREF raises the output voltage of the op-amp 18, which causes a drop in the output of the transistor 17. As a result, the output voltage VCL is fixed to (i.e., stays at) the clamp voltage that is set by the reference voltage Vref, such that the rise of VCL is controlled.

Figure 3:
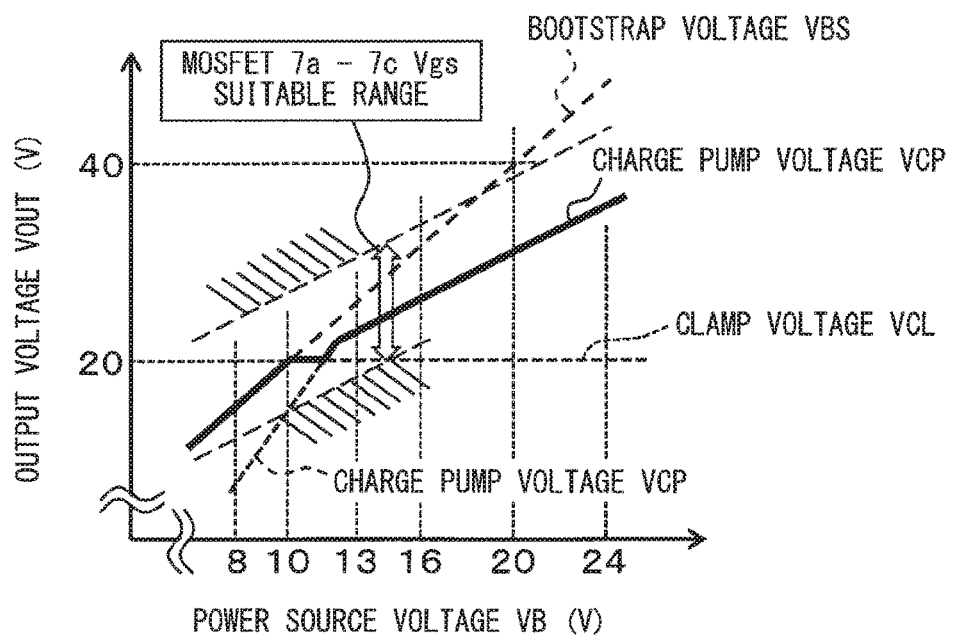
FIG. 3 illustrates a diagram showing an operational effect of the inverter device in the first embodiment of the present disclosure.

With reference to FIG. 3, a diagram showing the operational effects of the present embodiment is provided.

As described above, the power source voltage VB supplied from the battery is input from the power input terminal PIN of the inverter device 2, and supplied to the inverter main circuit 3, the bootstrap circuit 5, and the charge pump circuit 13. A power source circuit (not shown) supplies operational power to the control circuit 9 and the low-side drive circuit 11. The charge pump circuit 13 performs a voltage boost operation based on the power source voltage VB from the battery, and outputs a charge pump voltage VCP to the high-side drive circuit 10 via the diode 12.

The control circuit 9 drives the MOSFETS 7a-7c of the inverter main circuit 3 by using the high-side drive circuit 10 based on a drive instruction, and drives the MOSFETS 8a-8c by using the low-side drive circuit 11.

Accordingly, the motor 1 is rotationally driven by a three-phase AC output supplied to the motor 1 at the output terminals U, V, and W.

However, should the voltage level of the output terminals U, V, and W drop to ground, or should the voltage levels at the output terminals U, V, and W drop to the power source voltage VB level due to the operation of the inverter main circuit 3, the bootstrap circuit 5 performs a voltage boost operation, and generates the bootstrap voltage VBS, which is a high voltage.

When the voltage/potential level of an output terminals U, V, and W drops to the ground potential based on the operation of the inverter main circuit 3, the capacitor 15a-15c connected to the respective terminal is charged by the power source voltage VB, i.e., charged to the power source voltage VB level.

Thereafter, when the voltage/potential level at an output terminals U, V, and W change to the power source voltage VB level, the terminal voltage of a capacitor 15a-15c connected to the respective terminal rises to a voltage level almost twice as high as the power source voltage VB.

The bootstrap voltage VBS after such voltage boost is input to the input terminal C1 of the clamp circuit 6 via the diodes 16a-16c.

Since the bootstrap voltage VBS is output at a voltage level about twice as high as the voltage of the power source VB of the battery, the bootstrap voltage VBS will experience large voltage fluctuations when the power source voltage VB changes, for example, if the power source voltage VB fluctuates.

When the battery supplies electric power to other loads besides the inverter device 2, there will be large voltage drops of the power source voltage VB due to the other loads.

Thus, a normal state voltage, that is, a voltage free of large voltage fluctuations, is assumed as an average voltage VBave in a normal state of use of, for example, about 13V.

The clamp circuit 6 outputs a voltage VCL to the output terminal C2 without changing an input voltage when the input voltage VBS from the bootstrap circuit 5 does not reach a preset voltage level, and outputs VCL as a clamped voltage of 20 V, for example, by clamping the input voltage, when the input voltage VBS rises to be equal to or greater than the preset voltage level.

As shown in FIG. 3, the bootstrap voltage VBS rises with the power source voltage VB, as shown by a thick solid line, in a range below the clamp voltage, and, when it reaches the clamp voltage, VBS changes as shown to a dashed line.

That is, the bootstrap voltage VBS transitions when it reaches a voltage level about twice as high as the power source voltage VB.

On the other hand, the clamp circuit 6 outputs the clamp voltage VCL at a set level. The thick solid line of the clamp voltage VCL occurs when the bootstrap voltage VBS rises to the clamp voltage of 20 V.

The high-side drive circuit 10 operates by receiving the charge pump voltage VCP from the charge pump circuit 13, and, when VCP drops to a voltage level lower than the clamp voltage VCL, the high-side drive circuit 10 operates by receiving the clamp voltage VCL from the clamp circuit 6.

Note that, during the normal state of use, i.e., when the power source voltage VB is in a preset range which includes the average voltage VBave, the bootstrap voltage VBS of bootstrap circuit 5 is about 2*VBave. The preset range may be provided as an output from a vehicle battery or alternator (during normal operation) and may be in the range of about 11 V-14 V.

The clamp voltage VCL of the clamp circuit 6 is set to a voltage lower than 2*VBave, for example, 20V, so that in the normal state of use, the clamp voltage VCL output from clamp circuit 6 keeps the capacitors 15a-15c of the bootstrap circuit 5 from discharging.

Accordingly, by better controlling the discharge of the capacitors 15a-15c, the present embodiment provides such operational effects as increased efficiency by reducing the loss, heat generation, and electronic noise associated with capacitor discharge.

The charge pump circuit 13 outputs the charge pump voltage VCP, when the charge pump voltage VCP is greater than the clamp voltage VCL, i.e., a voltage higher than the voltage VCL from the clamp circuit 6, based on the power source voltage VB.

Accordingly, when the power source voltage VB during the normal state of use is at a value around the average voltage VBave, the high-side drive circuit 10 receives the output voltage VOUT, which is the charge pump voltage VCP output from the charge pump circuit 13, as the driving power source.

Further, when the power source voltage VB exceeds the average voltage VBave during a normal state of use of the battery, the high-side drive circuit 10 receives the output voltage VOUT, which is the charge pump voltage VCP output from the charge pump circuit, as the driving power source.

As a result, although the charge pump voltage VCP rises with the power source voltage VB, VCP, as shown in FIG. 3, stays within a suitable range to drive the gates of MOSFETS 7a-7c, i.e. a gate driving voltage Vgs. Thus, excessively high gate voltages due to the rise of the power source voltage VB are prevented.

On the other hand, when the power source voltage VB drops to less than the average voltage VBave during the battery normal state of use, the voltage VCP from the charge pump circuit 13 also falls, to be less than the clamp voltage VCL of the clamp circuit 6.

Where the charge pump voltage VCP drops below the clamp voltage VCL, since the output voltage of the clamp circuit 6 is the higher voltage, the voltage VCL output from the clamp circuit 6 is provided for the high-side drive circuit 10 as the output voltage VOUT.

At such time, since the bootstrap circuit 5 outputs a voltage VBS that is twice as high as the power source voltage VB, the bootstrap circuit 5 can supply a voltage higher than the voltage VCP of the charge pump circuit 13, even when the voltage VBS is lower than the clamp voltage VCL.

Thus, in the present embodiment, the clamp circuit 6 fixes the output voltage VBS from the bootstrap circuit 5 to a clamped value of the clamp voltage when VBS is equal to or exceeds the clamp voltage.

When the power source voltage VB of the battery is in the normal state of use range, or at a voltage greater than the normal state of use range of the battery, the clamp circuit 6 clamps the bootstrap voltage VBS, and the charge pump voltage VCP is usable as the output voltage VOUT by the high-side drive circuit 10.

As a result, the MOSFETS 7a-7c disposed on the high-side of the inverter main circuit 3 can be driven in the suitable gate voltage range. A suitable gate voltage range is a range selected to provide a longer gate oxide film life for the MOSFET while also providing sufficient gate resistance. For example, a gate voltage around 10 V provides sufficient gate resistance for the MOSFET. Further, even when the charge pump voltage VCP, due to a drop of power source voltage VB, cannot be used as the drive voltage of the high-side drive circuit 10, the bootstrap voltage VBS of the bootstrap circuit 5 can be used to drive the gates of the MOSFETS 7a-7c via the clamp circuit 6.

When the power source voltage VB of the battery is within the VBave range, i.e., within a range of the normal use level, the capacitors 15a-15c of the bootstrap circuit 5 can be kept from discharging, resulting in an efficiency improvement (i.e., the reduction of loss), the prevention of heat generation, and the reduction of noise, conventionally caused by the discharge of capacitors.

Further, since a low saturation type voltage stabilizer is realized as the clamp circuit 6 by using the bipolar transistor 17, the voltage drop of the voltage stabilizer in the power source voltage range where the bootstrap circuit 5 operates is minimized.

In the above-mentioned configuration, the clamp circuit 6 can either be a stand-alone IC in inverter 2, or can be integrated as an IC into controller 4.

Second Embodiment

Figure 4:
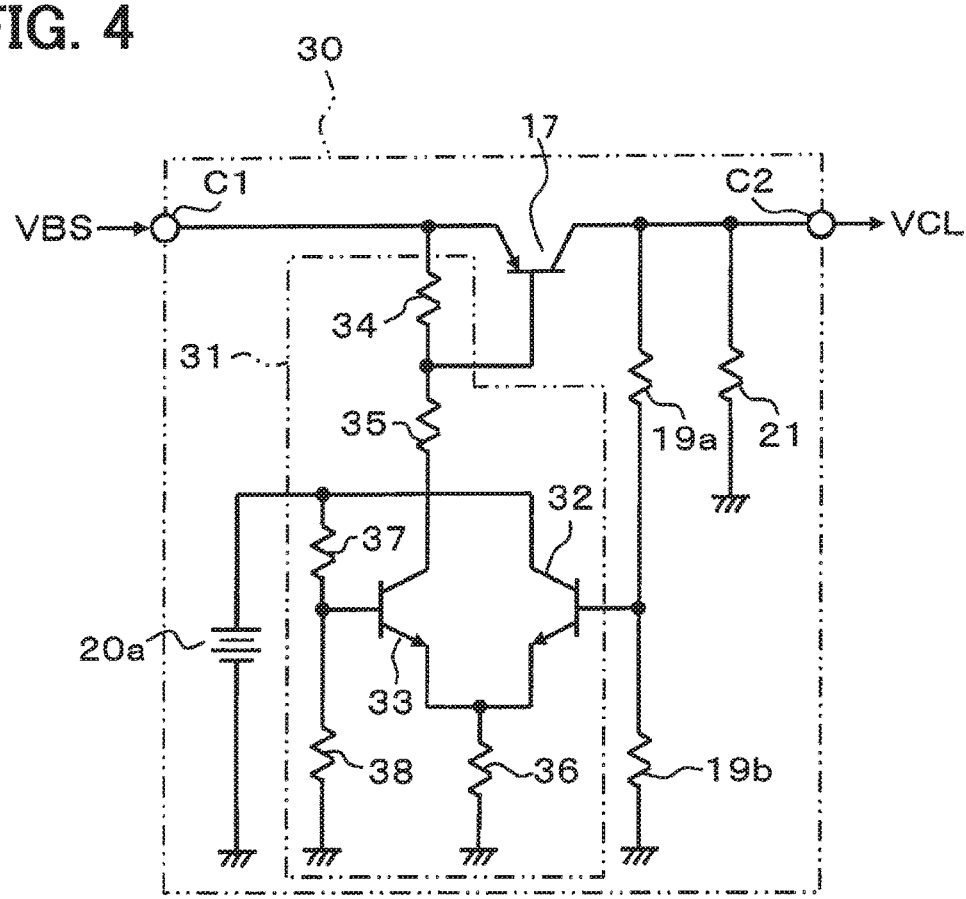
FIG. 4 illustrates a schematic diagram of a clamp circuit in a second embodiment of the present disclosure.

FIG. 4 shows the second embodiment of the present disclosure, and illustrates a different portion from the first embodiment.

According to the present embodiment, the op-amp 18 of the clamp circuit 6 in the first embodiment, is switched to a differential amplifier circuit 31 in a clamp circuit 30. In the clamp circuit 30, a reference power source 20a serves as an operational power source.

That is, in FIG. 4, the differential amplifier circuit 31 uses two NPN type transistors 32 and 33 for the differential inputs.

A collector of the transistor 33 is connected to the input terminal C1 via a series of resistors 34 and 35. The terminals of the resistor 34 are connected at a position between a base and an emitter of the transistor 17. An emitter of the transistor 33 is connected to ground via a resistor 36. A base of the transistor 33 functions as a non-inverted input terminal.

The series of resistors 37 and 38 is connected to the reference power source 20a, and the terminal voltage of resistor 38 is inputted to the base of the transistor 33.

A collector of the transistor 32 is connected to a positive terminal of the reference power source 20a, and an emitter of the transistor 32 is connected to ground via the resistor 36.

A base of the transistor 32 functions as an inverted input terminal, and receives a voltage divided output of the voltage divider circuit provided as a series of resistors 19a and 19b.

By adopting the above-mentioned configuration, the differential amplifier circuit 31 can serve as an equivalent of the op-amp 18 in the first embodiment, and can thus achieve the same operational effects as the first embodiment.

Third Embodiment

Figure 5:
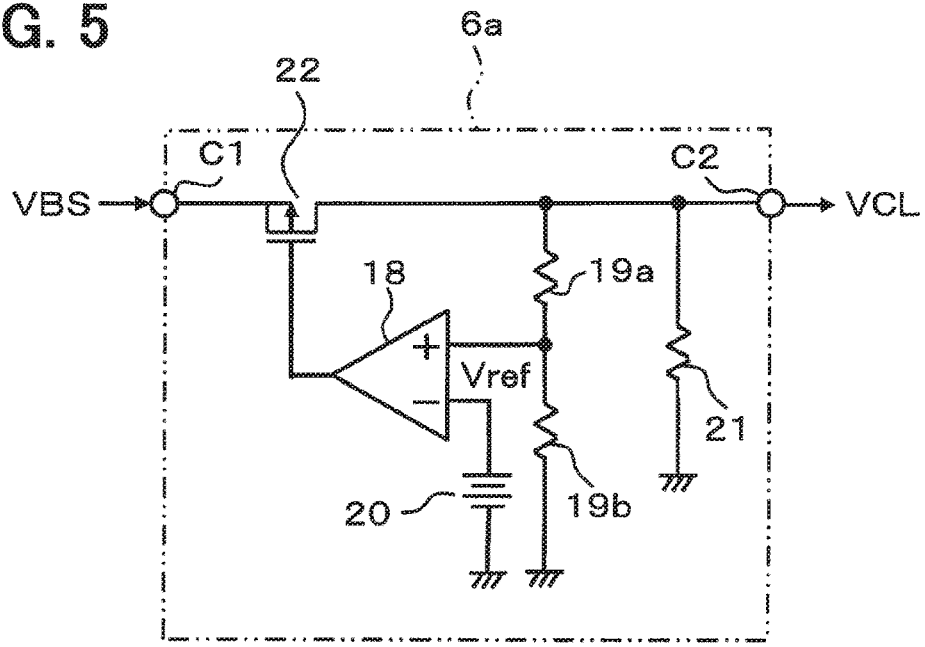
FIG. 5 illustrates a schematic diagram of a clamp circuit in a third embodiment of the present disclosure.

FIG. 5 shows the third embodiment of the present disclosure, and illustrates a different portion from the first embodiment.

According to the present embodiment, the PNP type bipolar transistor 17 of the first embodiment is replaced with a P-channel type MOSFET 22 provided in the clamp circuit 6a.

A source of the MOSFET 22 is connected to the input terminal C1, and a drain of the MOSFET 22 is connected to the output terminal C2. A gate of the MOSFET 22 is connected to the output terminal of the op-amp 18.

Therefore, the same operational effects as the first embodiment can also be achieved by the third embodiment.

Note that, the MOSFET 22 in the present embodiment may also be applicable to the clamp circuit 30 in the second embodiment.

Fourth Embodiment

Figure 6:
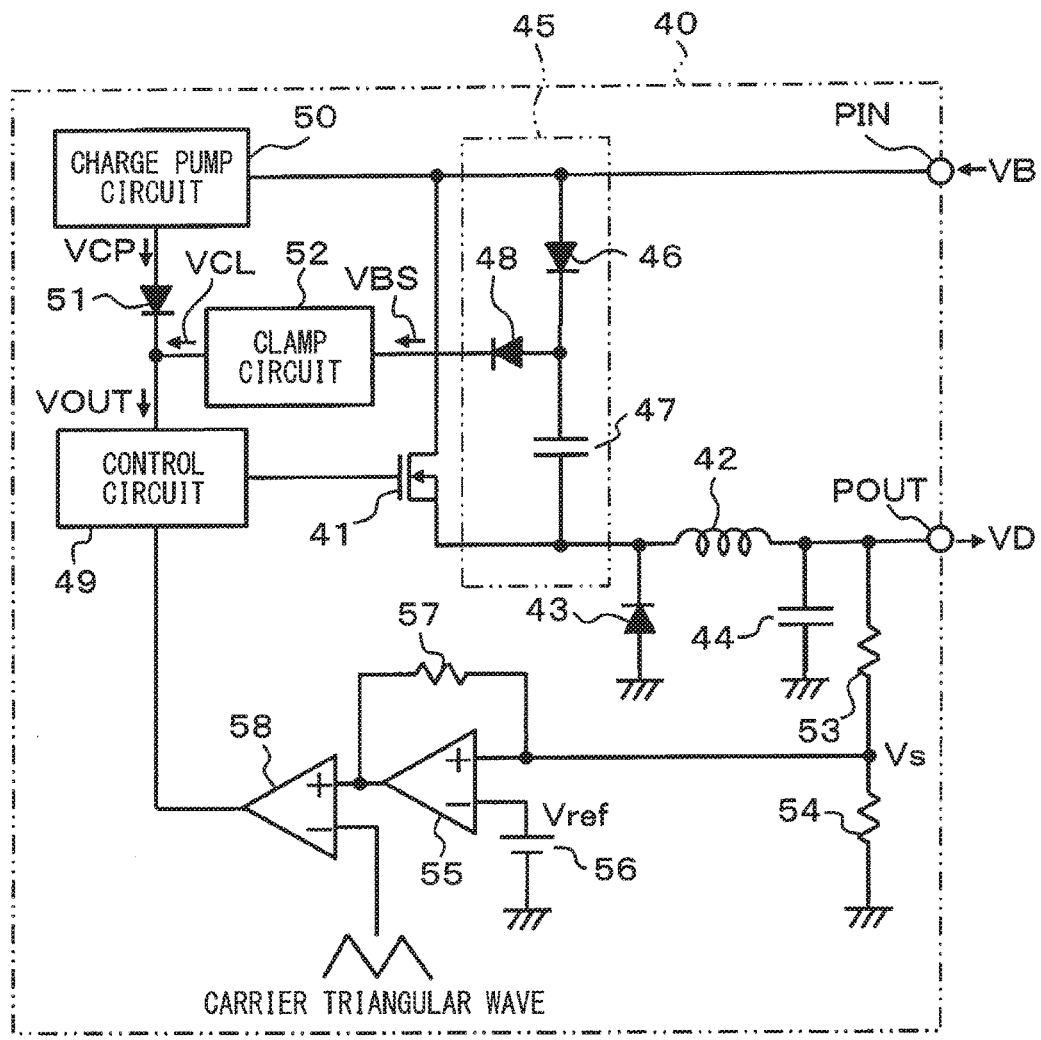
FIG. 6 illustrates a schematic diagram of a converter device in a fourth embodiment of the present disclosure.

FIG. 6 shows the fourth embodiment of the present disclosure where the converter circuit 40 may be used as a power converter.

In the converter circuit 40, a series circuit of an N-channel type MOSFET 41 and a coil 42 is connected at a position between the power input terminal PIN and a power output terminal POUT.

Two terminals of the coil 42 respectively have a diode 43 connected in an opposite direction and a capacitor 44 connected on a path to ground.

A bootstrap circuit 45 is connected at a position between a drain and a source of the MOSFET 41. The bootstrap circuit 45 is provided as a series circuit of a diode 46 and a capacitor 47, and the terminal voltage of the diode 46 is output as the bootstrap voltage VBS via a diode 48.

A control circuit 49 functions as a high-side drive circuit, and provides a high voltage gate drive signal to a gate of the MOSFET 41 so that the voltage of the output terminal POUT is set to a preset voltage VD.

A charge pump circuit 50 performs voltage boost of the power source voltage VB input from the power input terminal PIN, generates the voltage VCP for driving the MOSFET 41 via the control circuit 49. The charge pump circuit 50 supplies voltage VCP to the control circuit 49 via a diode 51.

A clamp circuit 52 outputs, upon receiving an input of the output voltage VBS from the bootstrap circuit 45, (i) VBS as is (i.e., without change) when VBS is equal to or less than the preset clamp voltage, or (ii) VCL, i.e., a fixed clamp voltage when VBS exceeds the preset clamp voltage.

The clamp voltage VCL is set to a level lower than the output voltage VCP of the charge pump circuit 50, when the power source voltage VB is within an average fluctuation range. As described above, the average fluctuation range of the power source voltage VB may be about 11V-14V.

The voltage VD of the output terminal POUT is detected by the voltage divider circuit made from a series of a resistor 53 and a resistor 54. A terminal voltage Vs of the resistor 54 in the voltage divider circuit is input into a differential amplifier 55. The differential amplifier 55 also receives an input of a reference voltage Vref from a reference power source 56, and outputs an amplified voltage that is the difference between terminal voltage Vs and the reference voltage Vref.

A resistor 57 is connected to the differential amplifier 55 (i.e., a comparator) at a position between the input and output terminals.

The output voltage of the differential amplifier 55 is input to the non-inverted input terminal of a comparator 58. A triangular wave used as a carrier wave is input to the inverted input terminal of the comparator 58.

The comparator 58 outputs a high-level signal when the output voltage of the differential amplifier 55 exceeds a level of the triangular wave, and generates a PWM control signal according to such comparison.

The control circuit 49 provides a gate drive signal to the gate of the MOSFET 41 when it receives the PWM control signal from the comparator 58.

At such time, the control circuit 49 applies a gate drive voltage exceeding the power source voltage VB to the gate of the MOSFET 41 for driving the gate of the MOSFET 41 on the high-side.

The control circuit 49 securely provides the gate drive voltage either as the output voltage VCP of the charge pump circuit 50, or as the output voltage VCL of the clamp circuit 52.

In such case, since the voltage VCP from the charge pump circuit 50 exceeds the output voltage VCL of the clamp circuit 52 when the power source voltage VB is within or above the average fluctuation range, the control circuit 49 generates the gate drive voltage from the voltage VCP.

On the other hand, when the power source voltage VB is less than the average fluctuation range, the output voltage VCP of the charge pump circuit 50 drops lower than the output voltage VCL of the clamp circuit 52. Since the bootstrap circuit 45 generates the voltage VBS, i.e., a voltage substantially twice as high as the power source voltage VBS, the clamp circuit 52 can supply voltage VCL to the control circuit 49 as a voltage higher than the output voltage VCP of the charge pump circuit 50, when VCP drops below the clamp voltage VCL.

In such manner, when the power source voltage VB is within or greater than the average fluctuation range, the voltage VCP is provided as an appropriate gate drive voltage for the gate of the MOSFET 41 via the clamp circuit 52 based on the voltage boost by the charge pump circuit 50.

When the power source voltage VB drops, thereby making the voltage VCP an insufficient gate drive voltage, the voltage VBS of the bootstrap circuit 45 can be used as an appropriate gate drive voltage for the gate of the MOSFET 41 via the clamp circuit 52.

Therefore, the same operational effects as the first embodiment can also be achieved by the fourth embodiment.

Note that, in the present embodiment, the configuration of the clamp circuit 52 may be borrowed from the one in the first embodiment, the second embodiment, or from the one in the third embodiment.

Other Embodiments

The present disclosure is not limited only to the embodiments mentioned above, but can be modified in various manners.

For example, the following can be considered as such modification.

Although the above-described embodiments describe a use of the PNP type bipolar transistor 17 in the clamp circuit 6, an NPN type bipolar transistor may also be usable, and a gate drive type semiconductor element such as a MOSFET and the like may also be usable.

Although, in the second embodiment, the differential amplifier circuit 31 is configured to use the bipolar transistors 32 and 33, the differential amplifier circuit 31 may also be configured to use a gate drive type semiconductor element such as a MOSFET and the like.

Although, in the above-described embodiments, the clamp voltage VCL and the output voltage VCP of the charge pump circuit are set to have a relationship of VCL<VCP when the power source voltage VB is within the average voltage range, the following modifications are also feasible.

That is, when the charging/discharging of the capacitor in the bootstrap circuit does not really cause a problem of heat generation, efficiency and/or electronic noise, the above-mentioned relationship between VCL and VCP may be relaxed.

Thereby, a power supply may be mainly provided from the clamp circuit, and the power supply may be provided from the charge pump circuit when the power source voltage VB rises.

Although the present disclosure is described based on the embodiments, it is understood that those embodiments do not limit the scope of the present disclosure. That is, when various changes, modifications and other equivalents are provided, those variations may also be included in the scope of the present disclosure separately or in combinations as defined by appended claims.

What is claimed is:

1. A power converter comprising:
    a gate-control-type semiconductor element provided on a power supply path from a power source to a load;
    a high-side drive circuit configured to provide a drive voltage to a gate of the gate-control-type semiconductor element, wherein a provided drive voltage is higher than a power source voltage;
    a charge pump circuit configured to generate and to supply an output voltage to the high-side drive circuit, wherein a generated output voltage is higher than the power source voltage;
    a bootstrap circuit configured to generate an output voltage higher than the power source voltage; and
    a clamp circuit configured to receive the output voltage of the bootstrap circuit, to clamp a higher-than-preset-value voltage to a clamp voltage, and to supply the clamp voltage to the high-side drive circuit, the clamp circuit including an input terminal, an output terminal, and a switching element connected in series between the input terminal and the output terminal, the clamp circuit disposed so that the switching element is connected in series between an output terminal of the bootstrap circuit and the output terminal of the clamp circuit, wherein the clamp circuit is further configured to output a constant voltage from the switching element.

2. The power converter of claim 1, wherein
the clamp circuit is configured to clamp a preset voltage for a direct output to the high-side drive circuit regardless of the output voltage of the bootstrap circuit.

3. The power converter of claim 2, wherein
the clamp circuit is configured to clamp the output voltage to the preset voltage relative to a ground voltage.

4. The power converter of claim 2, wherein
the clamp circuit is configured to generate the output voltage based on (i) a reference voltage set as a constant voltage relative to a ground potential and (ii) a division voltage derived from a voltage division of the output voltage.

5. The power converter of claim 2, wherein
the clamp circuit is configured to set the preset voltage to a voltage level lower than an output voltage of the charge pump circuit operating in a normal state by receiving a normal power source voltage.

6. The power converter of claim 2, wherein
the switching element is a bipolar transistor configured to receive the output voltage of the bootstrap circuit at an emitter and to output the constant voltage from a collector.

7. The power converter of claim 2, wherein
the switching element is a MOSFET configured to receive the output voltage of the bootstrap circuit at a source and to output the constant voltage from a drain.

8. The power converter of claim 1, wherein
the gate-control-type semiconductor element is disposed in an inverter circuit provided as a bridge connection of a plurality inverters and configured to convert a direct voltage to an alternating voltage.

9. The power converter of claim 1, wherein
the charge pump circuit is packaged together with the high-side drive circuit as a single integrated circuit package.

* * * * *